United States Patent [19]

Elliott

[11] Patent Number: 4,668,484
[45] Date of Patent: May 26, 1987

[54] TRANSPORT CONTAINERS FOR SEMICONDUCTOR WAFERS

[76] Inventor: David J. Elliott, 147 Rice Rd., Wayland, Mass. 01778

[21] Appl. No.: 579,368

[22] Filed: Feb. 13, 1984

[51] Int. Cl.$^4$ .................... B65G 69/20; B65D 81/24
[52] U.S. Cl. .................... 422/113; 422/243; 422/310; 312/31.1; 414/217; 206/207
[58] Field of Search .................... 156/345, DIG. 98; 414/217; 422/112, 113, 243, 310, 24; 206/453, 454, 207, 524.8; 137/71; 128/1 R; 250/455.1; 220/345; 312/31, 31.01, 31.1

[56] References Cited

U.S. PATENT DOCUMENTS

| | | | |
|---|---|---|---|
| 2,929,306 | 3/1960 | Graham | 220/345 X |
| 3,348,042 | 10/1967 | Umberg et al. | 206/454 X |
| 3,380,369 | 4/1968 | Allander | 128/1 R |
| 3,527,373 | 8/1970 | Giraudet et al. | 220/345 |
| 3,552,548 | 1/1971 | Wallestad | 206/1 |
| 3,709,210 | 1/1973 | Matthews | 128/1 R |
| 3,721,364 | 3/1973 | Lukaschewitz et al. | 220/345 X |
| 3,850,296 | 11/1974 | Hirata et al. | 156/DIG. 98 X |
| 3,872,884 | 3/1975 | Busdiecker et al. | 137/498 |
| 3,934,733 | 1/1976 | Worden | 206/454 X |
| 3,966,228 | 6/1976 | Neuman | 137/71 X |
| 3,976,330 | 8/1976 | Babinski et al. | 406/84 |
| 4,023,691 | 5/1977 | Peret | 414/403 X |
| 4,024,835 | 5/1977 | Scheu et al. | 269/21 X |
| 4,029,208 | 6/1977 | Fickler et al. | 206/454 |
| 4,030,622 | 6/1977 | Brooks et al. | 414/267 X |
| 4,043,451 | 8/1977 | Johnson | 206/334 |
| 4,061,228 | 12/1977 | Johnson | 206/454 |
| 4,066,401 | 1/1978 | Solomon | 422/40 |
| 4,091,919 | 5/1978 | MacLeod et al. | 206/213.1 |
| 4,129,211 | 12/1978 | Clement et al. | 206/565 X |
| 4,153,164 | 5/1979 | Hofmeister et al. | 206/454 X |
| 4,160,504 | 7/1979 | Kudlich et al. | 206/454 X |
| 4,238,346 | 2/1981 | Johnson | 206/334 |
| 4,306,731 | 12/1981 | Shaw | 269/254 R X |
| 4,378,189 | 3/1983 | Takeshita et al. | 414/225 |
| 4,427,332 | 1/1984 | Manriquez | 414/609 X |
| 4,450,960 | 5/1984 | Johnson | 206/508 X |

OTHER PUBLICATIONS

IBM Technical Disclosure Bulletin, "Cartridge Carrier", Brown et al., Sep. 1978.

Primary Examiner—David L. Lacey

[57] ABSTRACT

An improved transport container for semiconductor wafers includes chamber structure of sheet material with structure in the chamber for supporting the semiconductor wafers. The chamber includes a first access door portion through which the semiconductor wafers may be introduced into and removed from the chamber, a coupling for attaching the chamber to a source of inert gas for flowing inert gas through the coupling to create a positive pressure in the chamber, and a port spaced from the coupling for continuously releasing gas from the chamber preferably at a rate in the range of one-half to ten cubic centimeters per minute so that the wafers are exposed to a flowing, low but positive pressure inert gas environment during storage and transport.

16 Claims, 4 Drawing Figures

TRANSPORT CONTAINERS FOR SEMICONDUCTOR WAFERS

This invention relates to transport containers, and more particularly to transport containers for environmentally sensitive articles such as semiconductor wafers and the like.

Elements used in the fabrication of integrated circuits, such as silicon wafer and glass mask substrates, have highly polished surfaces with extremely fine geometries. The surfaces of such elements are very sensitive to particle contamination during several processing steps preceding the exposure steps (cleaning, priming, oxidation, resist coating, soft baking, etc.) as well as during processing steps that follow exposure of an energy sensitive coating (such as development, rinsing, etching, and doping). Collectively, these steps are termed lithography—the part of the microelectronic device fabrication process responsible for delineation of circuit patterns. During lithography processing, the wafer and mask substrates typically are handled inside clean rooms where the air is highly filtered and process operators wear clean room clothing. Since the largest single source of particulates is process operators, special care is taken to cover the operators, to keep human traffic in the clean room at the minimum required level, and special precautions and materials are used to reduce the quantity of airborne particulates in the process areas. Similar clean room techniques are used in the medical industry to provide low particulate level environments to protect bacterial cultures and other particulate sensitive materials.

Despite the many attempts to reduce airborne particulates to a near zero level, particle contamination continues to be a major problem for processes using air controlled clean rooms. Sources of such airborne particulates include eddy currents, differential pressures, and operator movement. The particle sizes of concern range from about 0.1 micrometer to ten micrometers, as particles larger than ten micrometers are typically filtered out of clean rooms by special filters. Particles, once lodged on a surface sensitive object such as a semiconductor wafer, a mask or biological specimen are often very difficult or impossible to remove, and sometimes cannot be removed without damaging the surface. In semiconductor manufacturing, particle-related defects have major and serious economic impact. Other problems in semiconductor substrate processing include the formation of oxides on freshly deposited or cleaned films which oxides change the functional properties of these films on wafer substrates. Also, light sensitive coatings on wafers can be damaged by exposure to white light inside or outside clean rooms.

In accordance with the invention, there is provided an improved transport container for semiconductor wafers or similar environmentally sensitive articles that includes a structure defining a chamber made out of sheet material with structure in the chamber for supporting the environmentally sensitive articles. The chamber includes a first access door portion through which the environmentally sensitive articles may be introduced into and removed from the chamber, a coupling for attaching the chamber to a source of inert gas for flowing inert gas through the coupling to create a positive pressure in the chamber, and port means spaced from the coupling for continuously releasing gas from the chamber preferably at a rate in the range of one-half to ten cubic centimeters per minute so that the articles are exposed to a flowing, positive pressure inert gas environment during storage and transport.

In preferred embodiments, the chamber structure is of tubular configuration with the coupling in its top wall carrying a submicrometer absolute filter, support structure (which may either be integral or removable) in the chamber including spaced flange elements for supporting a stack of semiconductor wafers in spaced relation one to another, a second access door portion for wafer manipulating apparatus, and interface structure in its bottom wall for cooperative engagement with wafer handling equipment. The chamber structure door structures cooperate with wafer handling equipment such that the doors are gradually and coordinately opened as the chamber is advanced into the wafer handling equipment to allow transfer of wafers to and from the support structures while continuing to provide a protective housing environment. A pressurized source of inert gas is coupled to the chamber by a control valve.

In a particular embodiment, the chamber is constructed of sheet material (such as an amber acrylic) that is substantially transparent to radiation in the yellow portion of the visible spectrum and substantially opaque to ultraviolet radiation and includes vertical guide structures; the doors are planar members disposed for vertical movement along the guides with the doors in closed position providing a substantially sealed wafer support chamber; the bleed port is formed in a pressure responsive member which releases on pressure in excess of about thirty psi to prevent damage to the semiconductor wafers; the inert gas is semiconductor grade dry nitrogen; and the valve in the coupling may be interlocked with the doors to modify the nitrogen flow rate when a door starts to open.

The transport container may be manually transported between automated wafer handling systems through areas (both inside and outside clean rooms) where the wafers might be exposed to harmful radiation (such as ultraviolet radiation) or to airborne contamination and interfaces with elevator equipment of such handling systems to maximize wafer surface protection. Other features and advantages will be seen as the following description of a particular embodiment progresses, in conjunction with the drawings, in which.

DESCRIPTION OF PARTICULAR EMBODIMENT

Figure 1:
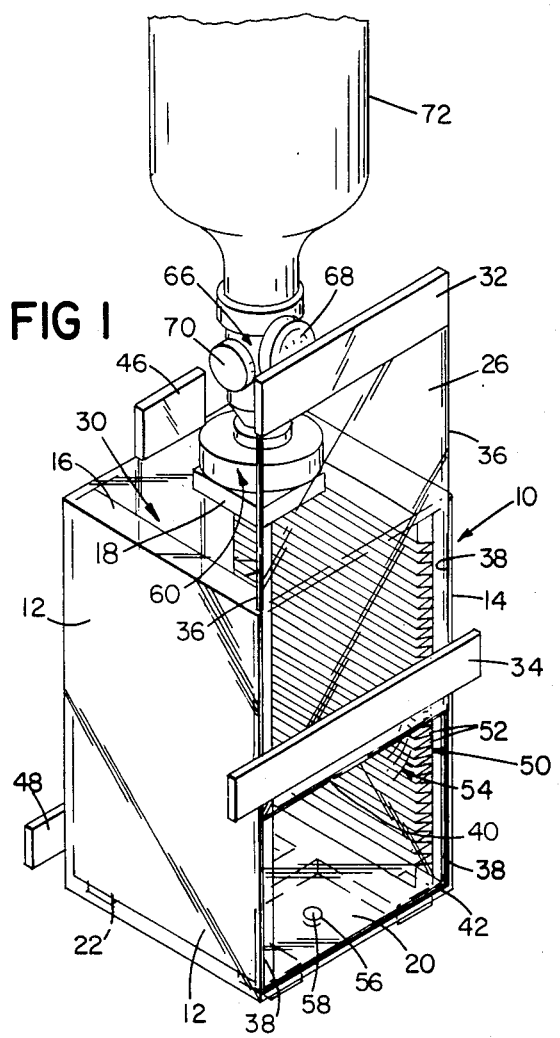
FIG. 1 is a perspective view of a transport container for semiconductor wafers in accordance with the invention.
Figure 4:
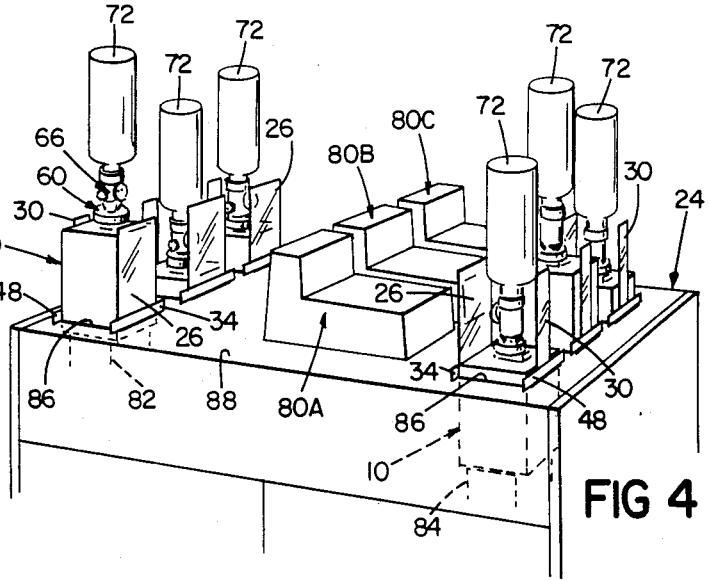
FIG. 4 is a perspective view of a three track wafer handling system with transport containers of the type shown in FIG. 1 on inlet elevators and output elevators.

The portable transport container shown in FIG. 1 includes chamber structure 10 of rectangular configuration that is constructed of sheets of amber acrylic material that has substantial transparency and yet is substantially opaque to ultraviolet radiation and to other harmful radiation in the visible region, the chamber structure includes side walls 12, 14; top wall 16 which carries fitting 18; bottom wall 20 which carries H-shaped interface structure 22 that is adapted to engage a cassette positioning mechanism on the elevator of wafer handling equipment 24, for example of the type shown in FIG. 4; planar front door 26; and back wall 28 which carries rear door portion 30. Front sliding door 26 (shown in a partially raised position in FIG. 1) extends the full length and width of the front of chamber 10 and includes a handle portion 32 at its top end, an actuator portion 34 adjacent its lower end; and edge flanges 36 which are received in grooves 38 in side walls 12, 14; and a similar flange 40 at its bottom edge which is received in groove 42 in bottom wall 20. Rear door portion 30 has similar flange and groove constructions 44 which extends the full length of the chamber, handle portion 46 and actuator portion 48. These door constructions provide a restricted and baffled path which blocks particulates so that, with the door 26 and door portion 30 closed, the chamber is substantially particle proof. Each handle portion 32, 46 can be grasped to lift the door, and actuator portions 34, 48 engage cooperating surfaces on the wafer handling equipment to provide coordinated opening of the doors to permit access for wafer handling equipment, such as pushers that slide wafers from a cassette chamber into the operating section of the wafer handling equipment.

Figure 2:
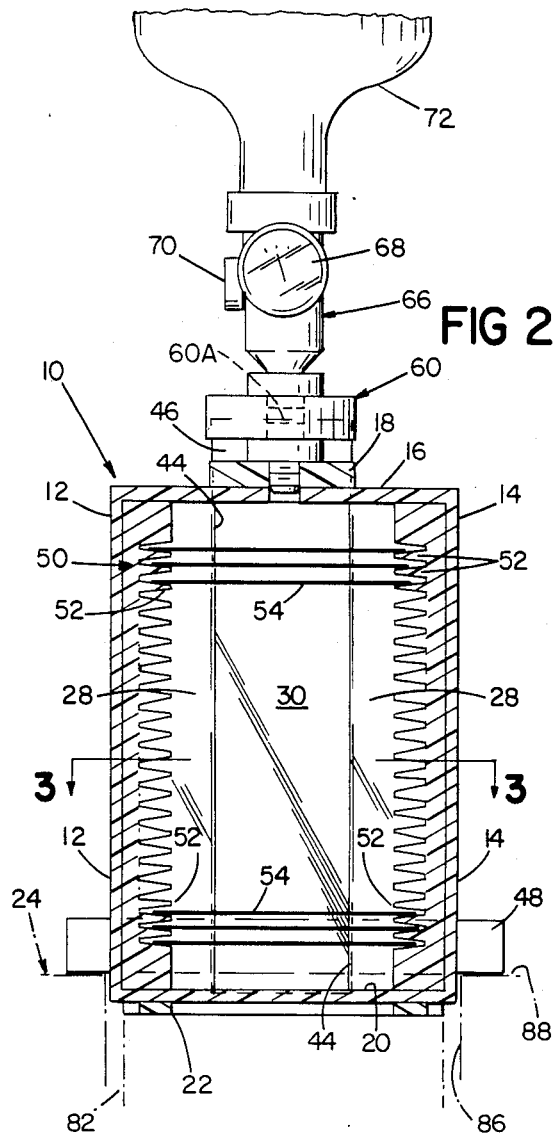
FIG. 2 is an elevational view, partially in section and taken along the line 2—2 of FIG. 3, of the transport container system shown in FIG. 1.
Figure 3:
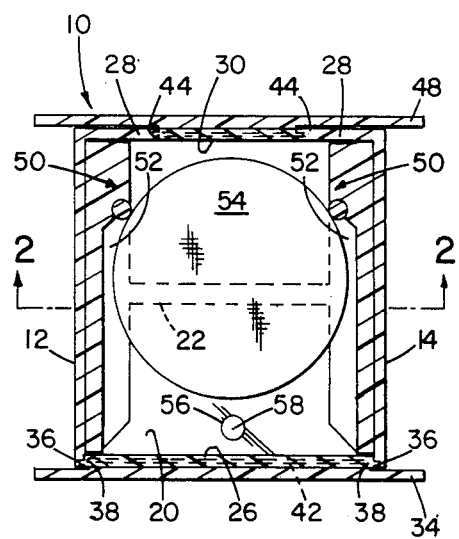
FIG. 3 is a sectional view taken along the line 3—3 of FIG. 2.

Support structure 50 in chamber 10 includes a series of spaced support flanges 52 on side walls 12, 14 that form stacked parallel support channels into which semiconductor wafers 54 may be placed as indicated in FIG. 2. Support structure 50 may be integral with side walls 12, 14 as shown or may be incorporated into a cassette unit that is insertable into and removable from chamber 10. The size of chamber 10 is dependent on the diameter of the semiconductor substrate wafers which typically may vary from diameters of seven and one-half centimeters to fifteen centimeters, a chamber that has capacity for twenty-five ten centimeter diameter wafers 54 having a width of about twelve and one-half centimeters, a depth (between doors 26, 30) of about fourteen centimeters, and a height of about eleven centimeters.

In the bottom wall 20 of chamber 10 is a port 58 of about 0.5 millimeter diameter size that is adapted to continuously release gas from chamber 10 at a rate of about one cubic centimeter per minute at a chamber positive pressure of three psi. A pressure relief member 56 is disposed in a wall of chamber 10. That member 56 may be a membrane in which port 58 is formed and which ruptures when the chamber pressure exceeds about two atmospheres, or an insert in top wall 16 adjacent fitting 18 which releases under a similar pressure to prevent excess pressure buildup in chamber 10.

Secured to chamber top wall fitting 18 is the outlet of filter unit 60 that has a housing of suitable material such as stainless steel or anodized aluminum and contains as diagrammatically indicated in FIG. 2, a flow restricting orifice, a pre-filter 60A rated for one micrometer nominal retention, an absolute particle filter rated at 0.1 micrometer pore size of silver or other material inert to nitrogen, and a support screen for preventing deformation of the filter.

Connected to the inlet of filter unit 60 is stainless steel regulator unit 66 that is fitted with pressure gauge 68 and control 70 that operates an internal valve. Mounted on regulator unit 66 is container 72 that holds about sixty liters of nitrogen (prefiltered to 0.5 micrometers and containing not more than 0.1 ppm of total impurities including miosture) at a pressure prior to use of about one-thousand psig. When control 70 is depressed, the regulator valve opens and nitrogen flows through regulator unit 66 and filter unit 60 into chamber 10 and out bleed port 58 creating a positive pressure (with the chamber doors 26, 30 closed) of about three psig or less at a nitrogen flow rate of about three cubic centimeters per minute so that the wafers 54 in chamber 10 are maintained in a positive pressure flowing nitrogen environment. In an alternate embodiment, chamber fitting 18 may be connected via a hose to a remotely located regulator and gas source. The container system provides a white light shielded, inert gas protective environment for wafers 54.

The water handling equipment 24 shown in FIG. 4 is three-track resist spin coating system that has three coating units 80A, 80B and 80C, each of which has an associated input elevator 82 and an output elevator 84. In use, container units 10, each with a coupled gas supply 72, are inserted into the well openings 86 of the respective elevators and their interface structures 22 engaged with the elevator structures, filled units being loaded onto input elevators 82, and empty units being loaded onto output elevators 84. As the inlet elevators move down, doors 26, 30 are gradually opened by operation of door opener members 34, 48 in cooperation with surface 88 of system 24, allowing the wafer handling equipment in each each of the tracks to remove a wafer 54 from its support, transfer that wafer for treatment by its coating unit 80, and then transfer the treated wafer to the container unit on its output elevator 84. As each wafer is removed from a container unit 10, the input elevator 82 is indexed down, and after each treated wafer is inserted into the container unit on an output elevator, that container is indexed upwardly by its output elevator 84 and its doors 26, 30 are gradually closed. When an input container is empty, the input elevator returns the chamber unit 10 to its original raised position and the container is removed and can be replaced by a loaded container. Empty containers can be reloaded by placing a filled cassette in juxtaposed relation to the empty chamber 10 with the door 26 open and tilting the juxtaposed chamber and cassette so that gravity causes wafers to slide from the loading cassette into the empty chamber 10.

While a particular embodiment of the invention has been shown and described, various modifications will be apparent to those skilled in the art, and therefore it is not intended that the invention be limited to the disclosed embodiment or to details thereof, and departures may be made therefrom within the spirit and scope of the invention.

What is claimed is:
1. A transport container system for semiconductor wafers comprising;
   portable chamber structure of material that is substantially opaque to ultraviolet radiation, said chamber structure having a top and a bottom,
   support structure in said chamber structure for supporting semiconductor wafers in generally horizontal parallel spaced relation,
   said chamber structure including a first access door portion through which wafers may be introduced into and removed from said chamber structure,
   a coupling at the top of said chamber structure for attaching said chamber structure to a source of inert gas for flowing inert gas through said coupling to create a positive pressure in said chamber structure, and bleed port means adjacent the bottom of said chamber for continuously releasing gas from said chamber structure at a rate of at least about one cubic centimeter per minute and providing a continuous downward flow of inert gas across semiconductor wafers on said support structure in said chamber structure to provide a flowing inert gas protective environment for semiconductor wafers in said chamber structure.

2. The container system of claim 1 wherein said chamber structure is constructed of sheet material that is substantially transparent to radiation in the yellow portion of the visible spectrum and substantially opaque to ultraviolet radiation.

3. The container system of claim 1 wherein said chamber structure includes interface structure for cooperative engagement with article handling equipment, and a second access door portion for wafer manipulating apparatus.

4. The container system of claim 3 wherein said chamber structure includes vertical guide structures, and said door portions are planar members disposed for vertical movement along said guide structures, said chamber structure with said door portions in closed position providing a substantially sealed wafer support chamber.

5. The container system of claim 1 and further including pressure responsive structure in said chamber which releases on excess pressure in said chamber to prevent damage to wafers housed in said chamber.

6. The container system of claim 5 wherein said bleed port means is formed in said pressure responsive structure.

7. The container system of claim 1 wherein said chamber structure is of tubular configuration and said coupling includes submicron absolute filter structure.

8. The container system of claim 1 wherein said chamber structure is sheet material that is substantially opaque to radiation in a substantial portion of the visible spectrum, said coupling contains control valve structure, prefilter structure, absolute filter structure of submicron poor size and a pressurized container of inert gas that provides a gas flow into said chamber structure when said control valve is open in the range of one-half-ten cubic centimeters per minute, and further including interface structure in the bottom of said chamber structure for cooperation with wafer handling equipment, and pressure responsive structure in said chamber structure which releases an excess pressure to prevent damage to wafers housed in said chamber structure.

9. The container system of claim 8 wherein said chamber structure is of rectangular configuration and has a front wall and a rear wall, said first access door portion is a planar sheet member on the front wall of said chamber structure that is mounted for vertical sliding movement, and further including a second planar access door portion on the rear wall of said chamber structure that is also mounted for vertical sliding movement, each of said door portions having structure for cooperation with wafer handling equipment for progressively moving said door portions to allow successive transfer of wafers to or from said chamber structure, and wherein said interface structure is of 'H' shaped configuration.

10. A portable transport container system for semiconductor wafers comprising;
chamber structure of material that is substantially opaque to ultraviolet radiation and that has significant visual transparency,
support structure in said chamber structure for supporting the environmentally and ultraviolet radiation sensitive semiconductor wafers in generally horizontal parallel spaced relation,
said chamber structure including a first access door portion through which wafers may be introduced into and removed from said chamber structure,
a container of inert gas, coupling structure attaching said inert gas container to the top of said chamber structure for flowing inert gas from said container through said coupling structure to create a positive pressure in said chamber structure, and
bleed port means adjacent the bottom of said chamber structure for continuously releasing gas from said chamber structure at a rate of at least about one cubic centimeter per minute and providing a continuous downward flow of inert gas across semiconductor wafers on said support structure in said chamber structure to provide a flowing positive pressure inert gas protective environment for said semiconductor wafers in said chamber structure.

11. The container system of claim 10 wherein said support structure in said chamber structure includes opposed, spaced flange elements for supporting a stack of semiconductor wafers in spaced relation one to another.

12. The container system of claim 11 wherein said chamber structure is of rectangular configuration and has a front wall, a rear wall, a top wall, and a bottom wall, said access door portion is a planar sheet member on the front wall of said chamber structure that is mounted for vertical sliding movement, and said container of inert gas is a pressurized container of nitrogen that is secured in general alignment with said chamber structure.

13. The container system of claim 12 and further including a second planar access door portion on the rear wall of said chamber structure that is mounted for vertical sliding movement.

14. The container system of claim 13 wherein each of said door portions has structure for cooperation with wafer handling equipment for progressively opening said door portion to allow successive transfer of wafers from said chamber structure.

15. The container system of claim 11 and further including interface structure of 'H' shape configuration in the bottom wall of said chamber structure for cooperation with wafer handling equipment.

16. The container system of claim 15 and further including pressure responsive structure in said chamber structure which releases on pressure in excess of about thirty psi to prevent damage to wafers housed in said chamber structure, and wherein said bleed port means has a diameter of less than one millimeter and is formed in said pressure responsive structure.

* * * * *